(12) United States Patent
Reichenbach et al.

(10) Patent No.: US 6,936,902 B2
(45) Date of Patent: Aug. 30, 2005

(54) SENSOR WITH AT LEAST ONE MICROMECHANICAL STRUCTURE AND METHOD FOR PRODUCTION THEREOF

(75) Inventors: Frank Reichenbach, Reutlingen (DE); Stefan Pinter, Reutlingen (DE); Frank Henning, Reutlingen (DE); Hans Artmann, Magstadt (DE); Helmut Baumann, Gomaringen (DE); Franz Laemer, Stuttgart (DE); Michael Offenberg, Kirchentellinsfurt (DE); Georg Bischopink, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 25 days.

(21) Appl. No.: 10/168,584

(22) PCT Filed: Dec. 14, 2000

(86) PCT No.: PCT/DE00/04454

§ 371 (c)(1),
(2), (4) Date: Oct. 3, 2002

(87) PCT Pub. No.: WO01/46066

PCT Pub. Date: Jun. 28, 2001

(65) Prior Publication Data

US 2004/0065932 A1 Apr. 8, 2004

(30) Foreign Application Priority Data

Dec. 21, 1999 (DE) .......................................... 199 61 578

(51) Int. Cl.[7] .............................................. H01L 29/82
(52) U.S. Cl. ....................... 257/415; 257/417; 257/418; 257/419; 257/420
(58) Field of Search ................................ 257/415–420, 257/619

(56) References Cited

U.S. PATENT DOCUMENTS

| | | | |
|---|---|---|---|
| 4,665,610 A | | 5/1987 | Barth |
| 4,766,666 A | | 8/1988 | Sugiyama |
| 5,139,624 A | | 8/1992 | Searson |
| 5,338,416 A | | 8/1994 | Mlcak |
| 5,919,364 A | * | 7/1999 | Lebouitz et al. ........ 210/321.84 |
| 6,378,378 B1 | * | 4/2002 | Fisher .......................... 73/754 |
| 6,426,239 B1 | * | 7/2002 | Gogoi et al. .................. 438/53 |
| 6,478,974 B1 | * | 11/2002 | Lebouitz et al. ................ 216/2 |

FOREIGN PATENT DOCUMENTS

| | | |
|---|---|---|
| DE | 42 41 045 | 5/1994 |
| DE | 195 37 814 A1 | 4/1997 |
| EP | 0 451 992 A | 10/1991 |
| GB | 2 198 611 A | 6/1988 |
| WO | 97 49475 A | 12/1997 |

OTHER PUBLICATIONS

Lebouitz K.S., et al: "Permeable Polysilicon Etch–Access Windows . . . " International Conference on Solid–State Sensors and Actuators and Eurosensors, Jun. 25, 1995, pp. 224–227.

Anderson R.C. et al: "Porous Polycrystalline Silicone . . . " Journal of Microelectromechanical Systems, Mar. 1994, USA, BD. 3, NR. 1, pp. 10–18.

* cited by examiner

Primary Examiner—Minh-Loan Tran
(74) Attorney, Agent, or Firm—Michael J. Striker

(57) ABSTRACT

A sensor has a foundation wafer having a sensor chamber, at least one silicon-based micromechanical structure integrated with the sensor chamber of the foundation wafer, at least one covering that covers the foundation wafer in a region of the sensor chamber, the covering including a first layer which is a deposition layer and is permeable to an etching medium and reaction products, and a hermetically sealing second layer which is a sealing layer and located above the first layer, the deposition layer which is the first layer being permeable in a region of the sensor chamber to the etching medium and a reaction product, the deposition layer for being permeable having structures selected from the group consisting of etching openings, porous regions, and both.

9 Claims, 10 Drawing Sheets

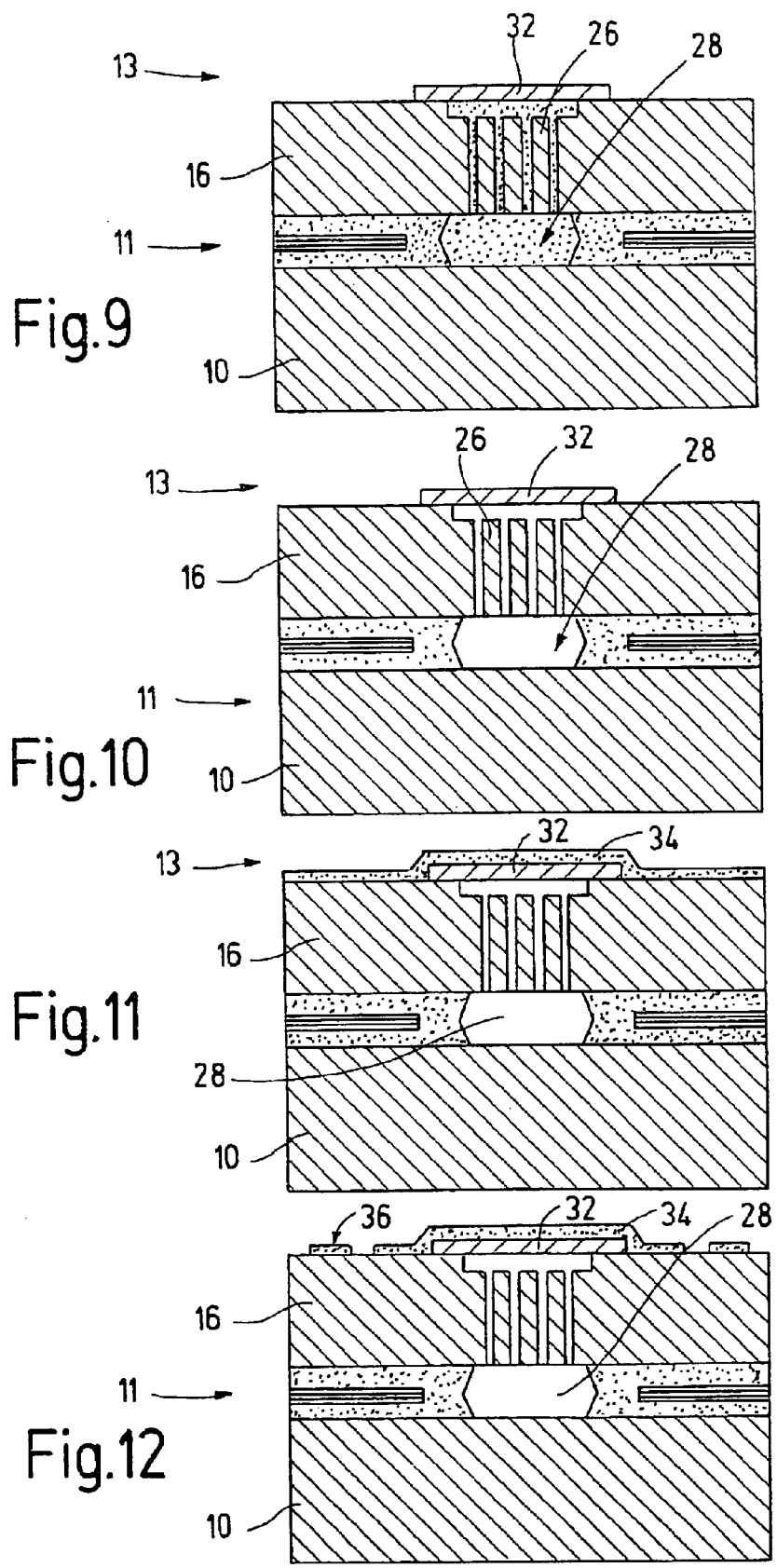

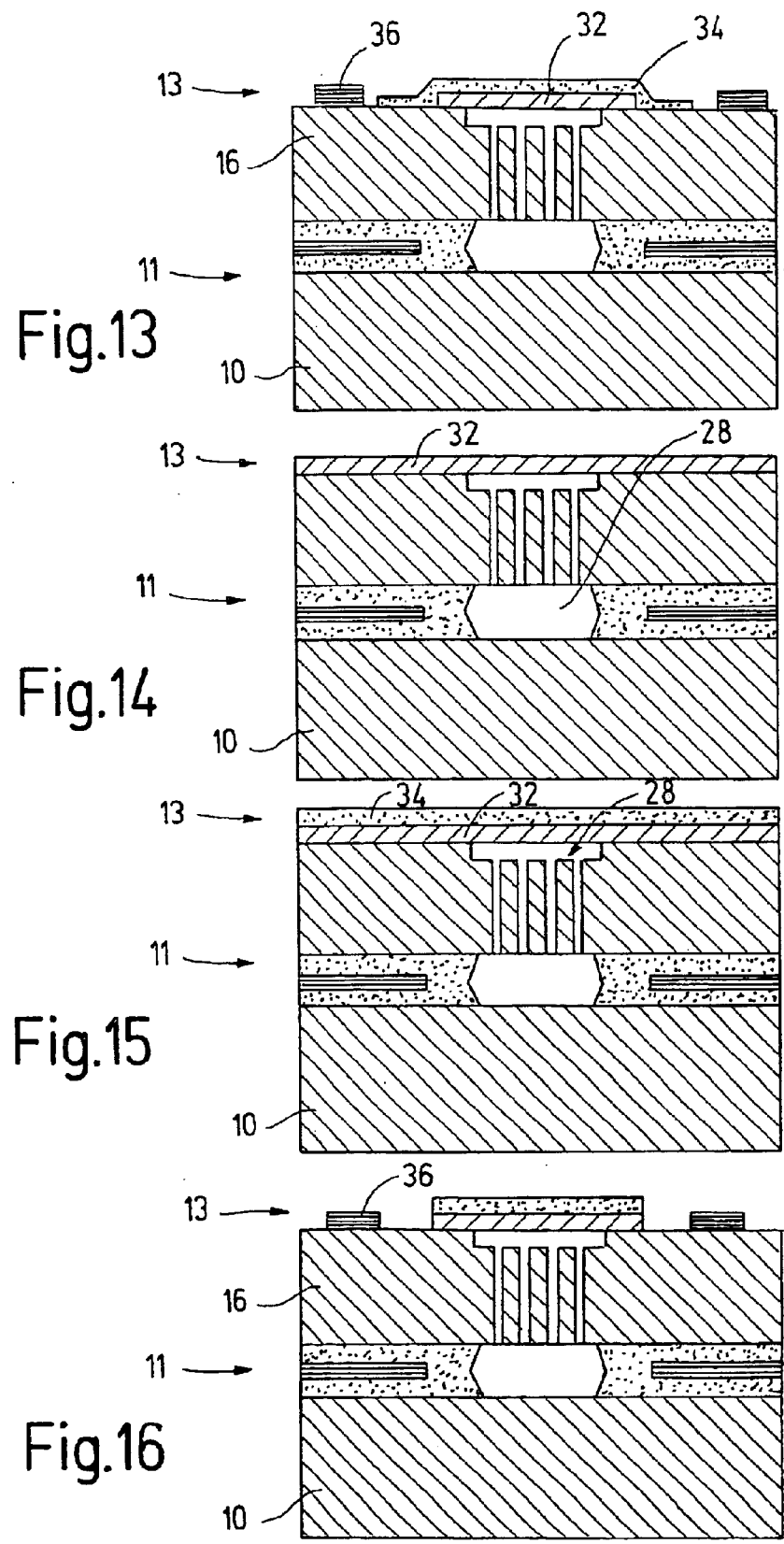

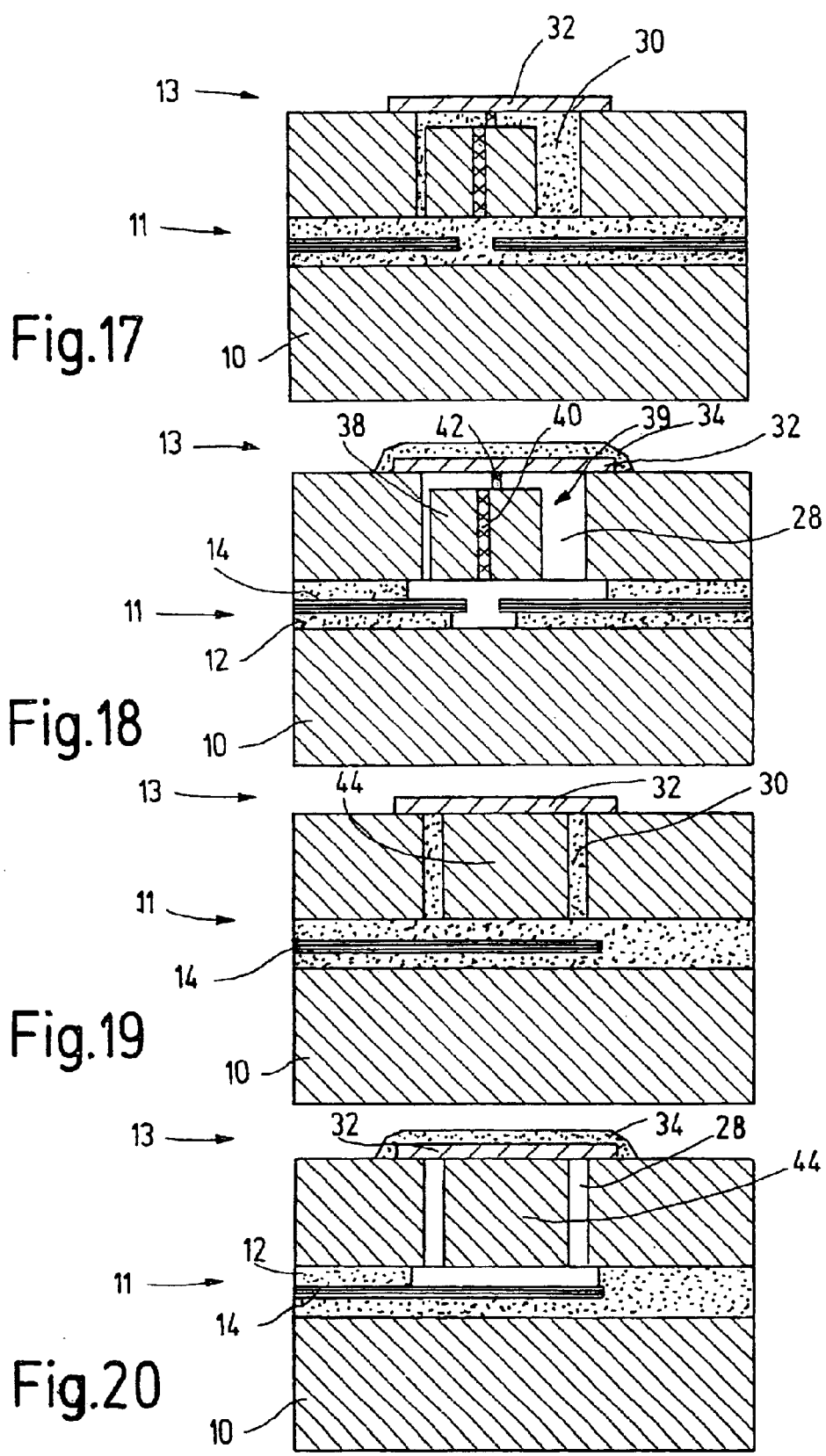

SENSOR WITH AT LEAST ONE MICROMECHANICAL STRUCTURE AND METHOD FOR PRODUCTION THEREOF

BACKGROUND OF THE INVENTION

The invention relates to a sensor with at least one silicon-based micromechanical structure, and to a method for producing such a sensor.

Sensors that have silicon-based micromechanical structures are known. If the micromechanical structure is movable element (sensor element), then such sensors can be used as acceleration sensors, rotary acceleration sensors, inclination sensors, resonant magnetic field sensors, or rotation rate sensors. Typically, these sensors comprise a foundation wafer, which is usually likewise formed from material that contains silicon, in which the structure is integrated into a so-called sensor chamber of its surface. To protect the structures and the atmosphere prevailing in the sensor chamber, the foundation wafer is covered with a cap wafer, with a covering that covers at least the sensor chamber. This cap wafer, because of its micromechanical prestructuring, has many individual caps joined together, of which each individual cap comes to rest exactly above the sensor chambers and is soldered to the sensor chamber in hermetically sealed fashion, and thus hermetically seals off the underlying sensor structure from the environment.

From German Patent Disclosure DE 195 37 814 A1, the production of such sensors is known. Based on a silicon substrate, insulation layers and conductive layers (in the form of electrodes or electrical connections) are applied in alternation, using the conventional method steps known from semiconductor technology. By means of masking and machining methods, also known, structuring of such layers can be done, for instance by way of lithography or etching processes. In an ensuing process step, a polycrystalline silicon layer (epipolysilicon), with a layer thickness ranging from a few nanometers to several tens of micrometers, preferably from 10 to 20 µm, is created. From this silicon layer, in the final analysis the required structures are etched out and made freely movable by underetching. The previously applied, structured, buried conduction layer makes it possible to establish electrical connections between elements of the sensors and the "outside world", in the form of so-called connection regions. These connection regions, which are connected via the conductive layer to sensor elements, carry a metallizing on their surface. The connection region with the metallizing applied over it serves to secure bonding wires, with which an electrical contact with the structures in the sensor chamber (sensor structure) is then to be established. The sensor structure described in DE 195 37 814 A1 is distinguished by the fact that it has a movable (free-standing) region with measurement capacitors, where changes in the measuring capacitance upon a deflection are used as a measurement variable.

The components of the sensor, all described as examples here, will simply be called the foundation wafer, for the sake of simplifying the further description. The foundation wafer must be hermetically tightly joined to the cap wafer in a final machining step. To that end, in the prior art it is provided that a cap be secured above each sensor chamber to the surface of the foundation wafer by means of a glass solder layer on the cap wafer (known as the seal-glass solder process). A disadvantage of this is that this technology is relatively expensive. The glass solder layer must be applied to the micromechanically structured cap wafer by means of screen printing. The cap wafer must already be structured on both sides to enable the ensuing covering and contacting of the sensor; that is, the cap wafer itself is already intrinsically expensive. Moreover, this capping technique requires a relatively large amount of space, in which up to about 75% of the individual element area is required for anchoring the cap to the sensor chip. The resultant structural height and limited structuring options preclude the use of certain especially economical housings for the sensor.

Often, the free-standing regions covered by the caps of the cap wafer are relatively large. Sensor structures often have edge lengths of several hundred micrometers. If such a sensor is subjected to a mechanical overload, then in an extreme case, sagging of the cover layer can lead not only to interference with the sensor properties but in the final analysis also to an excessive deflection of the sensor structure, to the point of irreversible damage.

SUMMARY OF THE INVENTION

According to the invention, the disadvantages of the prior art are overcome by the sensor and the method for producing the sensor having the characteristics of the invention. Because in that the covering comprises a first layer (deposition layer) that is permeable to an etching medium and the reaction products, and a hermetically sealing second layer (sealing layer) located above it, it is possible in terms of process technology to dispense with the expensive cap wafer, the conventional screen printing and soldering methods, and the large reserve areas for glass solder technology, and thus the processing can be completed substantially less expensive overall. Because (a) at least the sensor chamber present in the foundation wafer after the establishment of the structure is filled with an oxide, in particular CVD oxide or porous oxide;

(b) the sensor chamber is covered by a first layer (deposition layer), in particular of polysilicon, that is transparent to an etching medium and the reaction products or is retroactively made transparent;

(c) the oxide in the sensor chamber is removed through the deposition layer with the etching medium; and (d) next, a second layer (sealing layer), in particular of metal or an insulator, is applied to the deposition layer and hermetically seals off the sensor chamber, it is possible to enable structuring of the covering retroactively, via the making and machining methods known from semi-conductor technology.

By steps (a) and/or (b), planarizing of the wafer surface can be performed (for example by CMP, for Chemo-Mechanical Polishing). Existing processing problems resulting especially from topographies, such as applying and structuring the bond pads (metallizing), are thus circumvented. Compared to the established cap process, the simplified course of the process also produces markedly reduced production costs. The invention thus provides access to a sensor of the generic type and discloses a method for producing the sensor, by which it is possible for the first time to employ capping with a markedly lower structural height for hermetically sealing off sensor chambers in micromechanical structures, so that it is now possible to install them in the aforementioned, especially economical housings.

The permeability of the deposition layer for the requisite etching medium and the reaction products produced during the etching can be forced in two different ways. First, by anisotropic etching, etching openings can be made in the deposition layer, for instance by the silicon deep etching process patented in German Patent DE 42 41 045. The size and location of such etching openings can be defined in a very targeted way photolithographically by masking, so that it is possible among other things to keep any later exposure of the sensor chamber to the hermetically sealing material forming the sealing layer as slight as possible. It is possible to create etching openings that have a diameter of fractions of micrometers up to several micrometers and that can be sealed off in a relatively short time, in a manner to be described below. This is attained for instance by means of a high aspect ratio—that is, a ratio between the depth and diameter of the etching openings.

Second, for the covering, permeable materials such as silicon, polysilicon or epipolysilicon, which is already permeable because of the deposition conditions or is made permeable by subsequent processing, can be used, at least in some regions.

An advantageous method for forcing the transparency of the covering is to employ electrochemical etching operations. One such modification of the deposition layer is done in a suitable electrolyte, such as a mixture of hydrofluoric acid and ethanol. The silicon of the covering exposed to the etching operation is converted in this process into porous silicon, or in other words it is made porous. Regions of the deposition layer that are not to be made porous can be protected in a known manner by means of masking layers or suitable doping (such as n$^-$). An electrical connection by applying an anodic potential could be done both via the top side and the underside of the deposition layer. In the latter case, the anodic potential is applied to the layer of epipolysilicon located below the deposition layer and forming both the material comprising the sensor structures and the bond frame of the foundation wafer. It is advantageous in this respect that the bond frame can be joined directly electrically to the foundation wafer. An additional electrical connection between the foundation wafer and the covering exists in the form of support elements, which can be provided for the sake of mechanically stabilizing the covering. It is thus possible in a simple way to perform the electrical contacting of the deposition layer via the foundation wafer from the back side of the foundation wafer (back-side contact).

The etching operation can be additionally reinforced by irradiation in a wavelength range from 100 nm to 1000 nm, in particular between 350 nm and 800 nm. In this way, the machining of the deposition layer can be done especially homogeneously. It is furthermore advantageous, by means of targeted doping of the deposition layer, to vary the porosity and thus the permeability of the porous silicon. For instance, p-doping is used to create mesoporous pores, while an n-doping can be used to create etching openings with a diameter ranging from a few nanometers up to several micrometers.

It has also proved advantageous to force the permeability of the deposition layer by means of an also retroactively employed modified stain-etch operation, in which a mixture of hydrofluoric acid, nitric acid and water is employed. The porosity and depth of the etching can be adjusted via an adjustment of the mixture proportions and exposure times.

It has also proved especially advantageous to create the permeability of the deposition layer by means of a galvanic process, in which a metal layer is applied to the region of the covering that is not to be changed. Simultaneously, the metal layer takes on the function of a masking layer and need not necessarily be removed before the later sealing layer is applied. It comprises a metal that is nobler than silicon, in particular such noble metals as platinum and gold. The porosity of the porous (poly)silicon created during the galvanic process can be varied as a function of a current density and the electrolyte composition, and in particular via the area ratio of metal to silicon, since the latter represents the galvanic element, that is, the current source.

It has also proved advantageous that support elements are provided on the underside of the deposition layer, which establish a mechanically stable connection between the foundation wafer and the covering. If the individual support elements or support struts are spaced apart from one another by from several micrometers to several tens of micrometers, then on the one hand excessive sagging of the cover plate upon subjection to an overload is prevented, and on the other, the overall stability is increased substantially.

It has furthermore proved advantageous to structure the sealing layer as well by means of a masked etching process. The etching process used can also include structuring the deposition layer and optionally even further an upper layer of the foundation wafer, in particular of epipolysilicon.

In a further advantageous feature of the method, the pressure inside the sensor chamber can be adjusted by way of the pressure conditions that prevail during the deposition of the sealing layer. The process pressure prevailing during the deposition of the sealing layer will automatically become established in the sensor chamber as well and be sealed in there, while the sealing layer is growing. Deposition processes that can be considered for the sealing layer are sputtering processes (for metal layers) or PECVD processes (for SiN, SiO, SiC, etc.). If the enclosed pressure should not prove identical to the deposition pressure, additional options still exist. Advantageously, to that end, before or during the deposition the sensor is subjected to an inert gas, in particular helium, at a predetermined temperature that is introduced additionally into the deposition chamber. Because of the permeability of the deposition layer, a delayed pressure equalization can occur, and the fundamental diffusion processes can be ascertained empirically. Since the suppression of the pressure equalization is achieved by applying the sealing layer at layer thicknesses of even only a few micrometers or less, the sealing can be done within relatively short times.

Via the aforementioned method steps of the invention, capacitive pressure sensors can also be made in an especially simple way. As a common feature, such pressure sensors have a differential capacitor array, which is joined directly or via a coupling element to the covering, so that sagging of the covering causes a change in the capacitances of the differential capacitor array, and this change in turn serves as a measurement variable.

Further preferred features of the invention will become apparent from the other characteristics recited in the dependent claims.

BRIEF DESCRIPTION OF THE DRAWINGS

The invention will be described in further detail below in terms of exemplary embodiments in conjunction with the associated drawings. Shown are:

FIGS. 1–13, the production method according to the invention in one exemplary embodiment;

FIGS. 14–16, an alternative production method, beginning after the deposition of a sealing layer in accordance with FIG. 8;

FIGS. 17 and 18, a further feature of the production method for creating a surface-micromechanical capacitive pressure sensor with a torsion rocker;

FIGS. 19 and 20, a further alternative embodiment of the capacitive pressure sensor;

FIG. 34', an alternative embodiment with a dielectric as the seal and with a metal contact pad.

DESCRIPTION OF THE PREFERRED EMBODIMENTS

FIGS. 1–13 illustrate the production method according to the invention for sensors, such as acceleration sensors or rotation rate sensors, and in particular also capacitive pressure sensors. The method steps sketched in FIGS. 1–4 are already known from DE 195 37 814 A1 and will therefore be described below only briefly.

By definition, a subdivision of the sensor has already been made into a foundation wafer 11 and a thin-film sensor cap in the form of a covering 13. The foundation wafer 11 includes all the components necessary for the function of the sensor, and in particular includes contact regions to be described in further detail hereinafter, as well as micromechanical structures and electrodes. The covering 13 by definition extends from a deposition layer to and including a sealing layer and serves the purpose of hermetically sealing a sensor chamber, in which the micromechanical structures are located.

Figure 1:
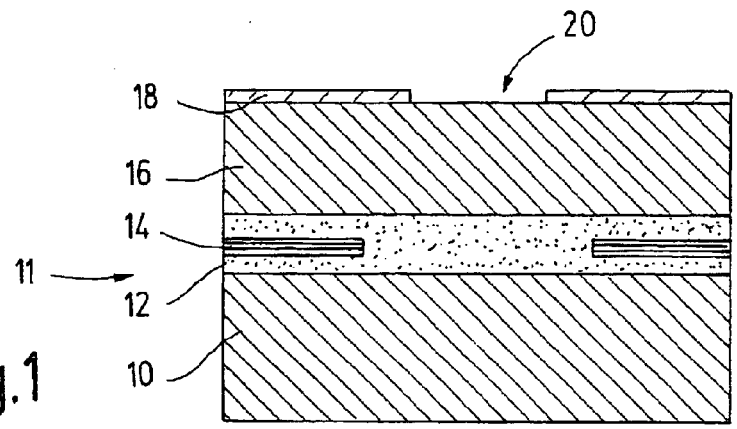

Onto a silicon substrate 10, an insulation layer 12, which encloses a conductive layer 14, is applied. Structuring of the two layers 12 and 14 can be done by known method steps used in semiconductor technology, such as lithography and etching processes and subsequent etching steps. A polycrystalline silicon layer 16 of desired layer thickness is also applied, which covers the insulation layer 12. The silicon layer 16 typically comprises epipolysilicon, while the conductive layer 14 is shaped of an optionally very highly doped polysilicon (FIG. 1).

Figure 2:
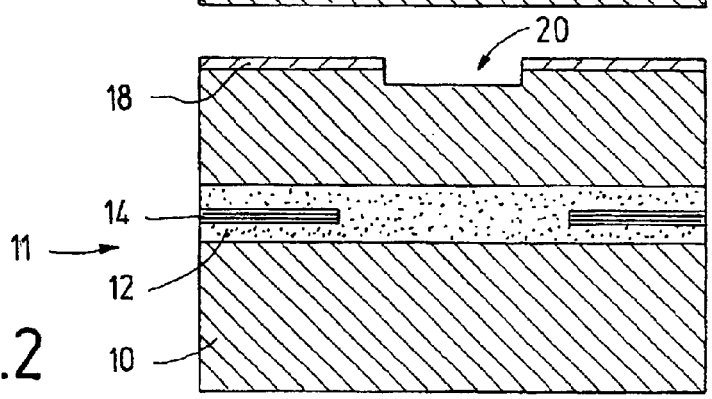
Figure 3:
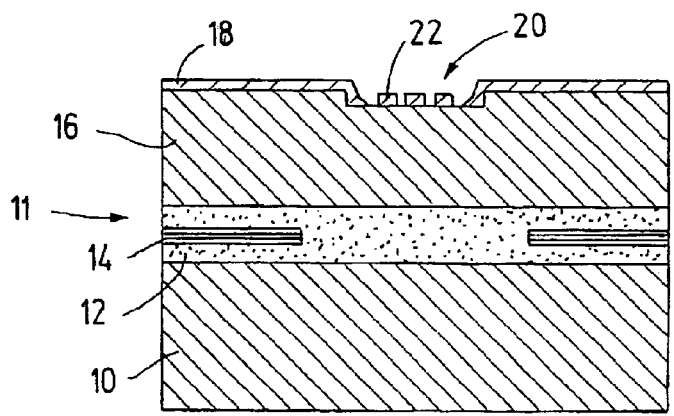

By application of a masking layer 18, a region 20 is defined in which in later method steps the micromechanical structure is to be created. First, the region is deepened (recess 20; FIG. 2) by a pre-etching step.

In an ensuing lithography step (FIG. 3), the thus-prestructured foundation wafer 11 is coated in the recess 20 with a mask 22 of photoresist, which in advance defines the sensor structures to be made, such as capacitive comb structures, springs, stops, electrode faces, and perforations in a seismic mass. What is essential here is that the actual sensor structures be made with an adequately great spacing from the edges of the previously made recess 20, because there the precision of lithography and resolution are otherwise impaired by the differences in topography.

Figure 4:
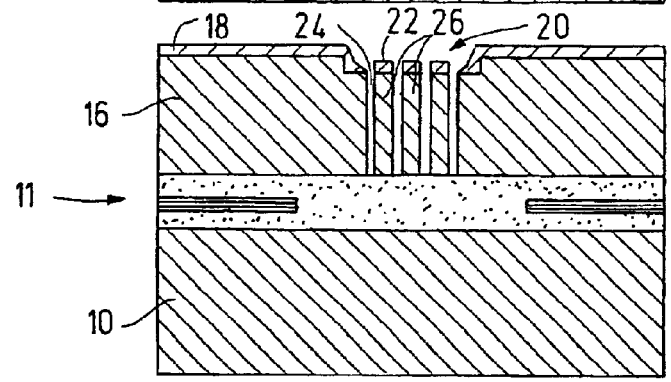

As can be seen from FIG. 4, in the regions not covered by the photoresist 22, trenches 24, which extend as far as the insulation layer 12, are made by known, suitable etching processes, such as in the manner described in DE 42 41 045.

In this way, individual structures 26 are insulated on the silicon layer 16. The design of such structures 26—since it is known—will not be addressed in further detail in conjunction with the present description.

Figure 5:
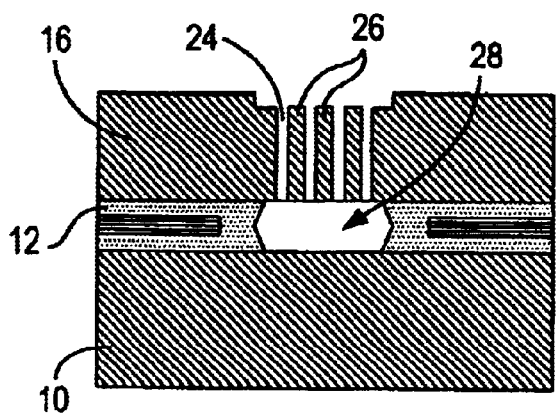

Next, sacrificial layer etching is done via the trenches 24 in the region of the insulation layer 12, and a void is created (FIG. 5). The void the trenches 24 together form a sensor chamber 28, in which the structures 26 are accommodated. The sacrificial layer etching can be done for instance via an HF vapor etching process, or dry sacrificial layer etching with silicon as the sacrificial layer in conjunction with a modified layer system. The resist mask 22 was removed before the conclusion of the sacrificial layer etching. In the case of dry sacrificial layer etching with silicon as the sacrificial layer, the masking layer 18 is removed after the conclusion of the sacrificial layer etching.

Figure 6:
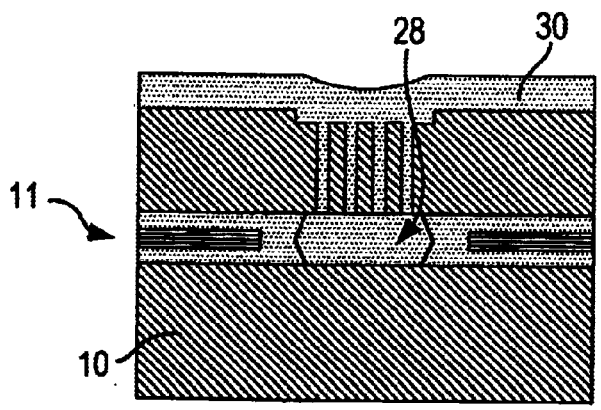
Figure 7:
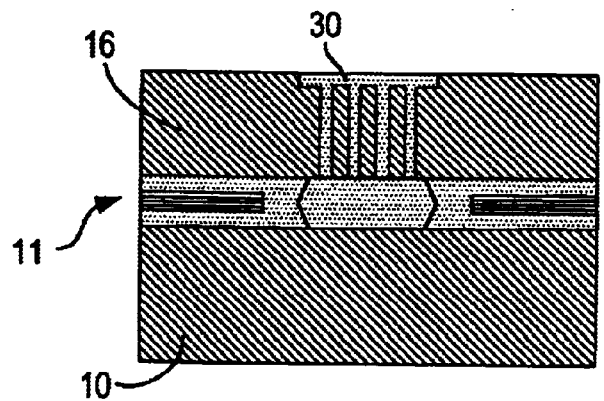

The entire structure is filled, in the method step sketched in FIG. 6, with a silicon-based oxide 30, in particular a CVD oxide or a porous oxide. The preferably highly porous oxide 30 must be removed again at an extremely high etching rate using media that contain hydrofluoric acid. The deposition conditions for the oxide 30 should accordingly be selected such that a low-grade oxide 30 of high porosity is created. These are at the same time the conditions of deposition under which deposition is done at the highest possible rate, which has the advantage of short oxide deposition times. The parameters for designing the deposition conditions of such low-grade oxides of high porosity are known from the prior art. For instance by means of high plasma capacities, the desired oxide film 30 can be deposited during the deposition, at high process pressures and low substrate temperatures (such as 200° C. to 300° C.).

The next method step includes a re-thinning of the oxide 30 to the height of the silicon layer 16 (FIG. 7), which can be done for instance by grinding (CMP or Chemo-Mechanical Polishing) or a well-known back-etching method. In the exemplary embodiment, the oxide 30 is removed down to the height of the layer 16.

Figure 8:
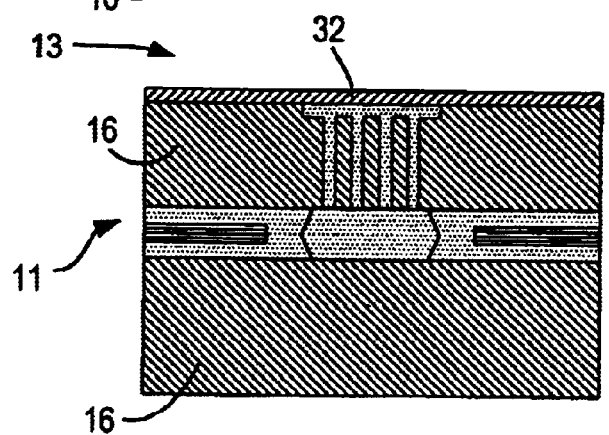

Next, a deposition layer 32, in particular of polysilicon, is deposited as a deposition layer over the entire surface (FIG. 8). To avoid compaction of the highly porous oxide 30, it is advantageous to keep the temperatures as low as possible during this deposition. At the usual temperatures for polysilicon deposition of 600° C. to 650° C., for instance, no significant compaction of the oxide 30 yet occurs. As an alternative, it is possible to perform a brief heating of the foundation wafer 11 to temperatures of over 1000° C., without compacting the oxide 30, if this heating is done only briefly (for instance for less than 10 minutes). The tempering of the deposition layer 32 can advantageously be done with the aid of an RTP (Rapid Thermal Processing) or RTA (Rapid Thermal Annealing) reactor. If epipolysilicon is deposited as the deposition layer 32, then this deposition can be performed in an epitaxial reactor at a high deposition rate of up to 1 $\mu$m/min, in order to keep the deposition times short. By means of such a brief, high temperature treatment of the polysilicon, it can be attained for example that the layer 32 has a very high intrinsic tensile stress of over 200 MPa/$\mu$m up to 1 GPa/$\mu$m of layer thickness, for example, which is quite advantageous for applying the layer 32 as a covering 13. Because of this high tensile stress, the layer 32 can withstand even a high pressure applied from outside without bulging inward severely.

In an ensuing optional process step, the deposition layer 32 can be structured, for instance by etching (FIG. 9). In the final analysis, then only the regions of the foundation wafer 11 among which the micromechanical structures 26 are later to be located inside the sensor chamber 28 will be covered by the deposition layer 32. It is also possible to use the covering 13 unstructured. In that case, the covering 13 covers the entire wafer surface. The advantage then is that a planar surface of the wafer is preserved.

By selective etching of the oxide 30 underneath the deposition layer 32, it is possible to expose the structures 26 again (FIG. 10). To that end, the deposition layer 32 must necessarily be permeable to the etching medium used and to the products created during the reaction. For instance, the polysilicon of the deposition layer 32 can be provided for this purpose with small etching openings by targeted etching, in a manner to be described in further detail later herein. Depending on the type of etching process used, etching openings with diameters of 0.1 $\mu$m to 5 $\mu$m can be created. As an alternative, the deposition layer 32 can comprise a permeable polysilicon or a polysilicon that is made permeable retroactively by porosification, which allows the etching medium or reaction products to pass through. In conjunction with hydrofluoric acid vapor etching processes, this variant has proved especially advantageous, since the hydrofluoric acid vapor can penetrate polysilicon especially easily, and diffusion events for the species involved through the polysilicon can be speeded up, especially at elevated temperatures. The in-situ permeability of the polysilicon is especially high at low dopant concentrations, as long as a long-lasting high-temperature treatment (tempering) is avoided. It is also possible to employ a combination of HF liquid-phase etching and HF vapor etching to remove the sacrificial layer. In the wet etching phase (HF solution), the majority of the oxide 30 is first removed. In the ensuing vapor etching, the remainder of the oxide 30 is removed without the risk of sticking, resulting in an overall faster process.

After the conclusion of the sacrificial layer etching process, the deposition layer 32 is hermetically closed by deposition of a sealing layer 34 (FIG. 11). It has proved especially advantageous to apply a silicon nitride layer as the sealing layer 34, because that can be deposited at even relatively low temperatures of 300° C. to 400° C. in PECVD processes. As an alternative, the sealing can also be done by depositing metals, such as aluminum, for which sputtering processes are particularly well suited.

Depending on the material chosen for the sealing layer 34, a structuring of the covering 13 can then be done, for instance with the aid of photolithographic processes. If the chosen material is a metal (FIG. 12), then by means of these structurings the contact pads 36 can simultaneously be formed. In the case of a dielectric material, the sealing layer 34 must be removed completely outside the capping region, and the contact pads 36 are applied (FIG. 13) in a separate method step to the silicon layer 16 or the deposition layer 32 (if the latter is used unstructured over its full surface). The chosen layer thickness of the sealing layer 34 depends essentially on the permeability, porosity, and diameter of the etching openings of the deposition layer 32, and it is understood that a thicker sealing layer 34 is required for closing the etching openings.

FIGS. 14–16 show an alternative process course, beginning with the deposition of the deposition layer 32 as shown in FIG. 8. First, in the manner already explained, the oxide 30 is etched away through the deposition layer 32 (FIG. 14). Next, by means of the sealing layer 34, the sensor chamber 28 is hermetically sealed (FIG. 15). Once again, the layer thickness must be selected to suit the properties of the deposition layer 32, which are adjusted for the sake of the passage of the etching medium or reaction products. Next, by a masked etching process shown in FIG. 16, both the deposition layer 32 and the sealing layer 34 are removed, and the contact pads are applied to the silicon layer 16 in a known manner. Overall, this makes it possible to dispense with one mask plane, since the two layers 32, 34 are structured with one and the same mask. In the case where permeable polysilicon is used as the deposition layer 32, an adequate resistance must be assured after the structuring to prevent a diffusion of gases via the peripheral regions. In practice, it has been found adequate if the permeable polysilicon layer overlaps the epipolysilicon layer 16 by at least 50 $\mu$m.

Figure 32:
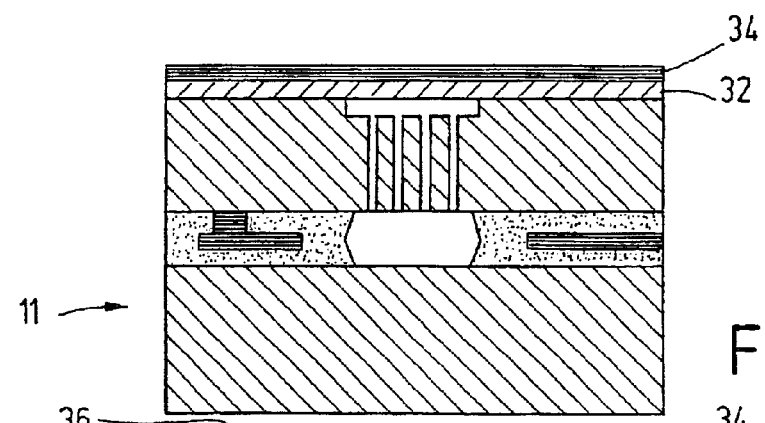
FIGS. 32–34, a further feature of the production method for producing a metal seal and a metal contact pad.
Figure 33:
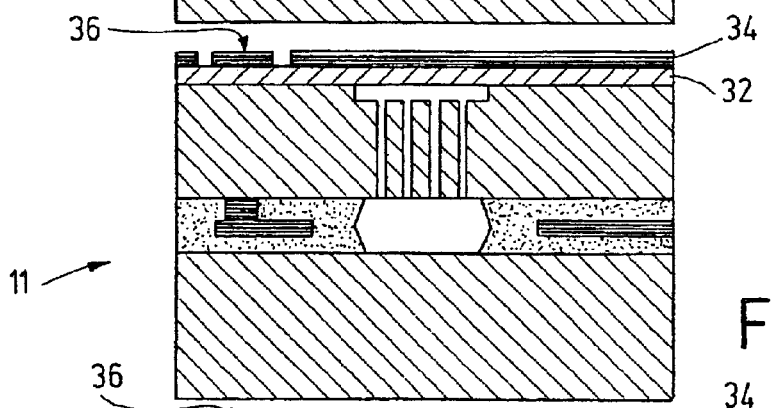
Figure 34:
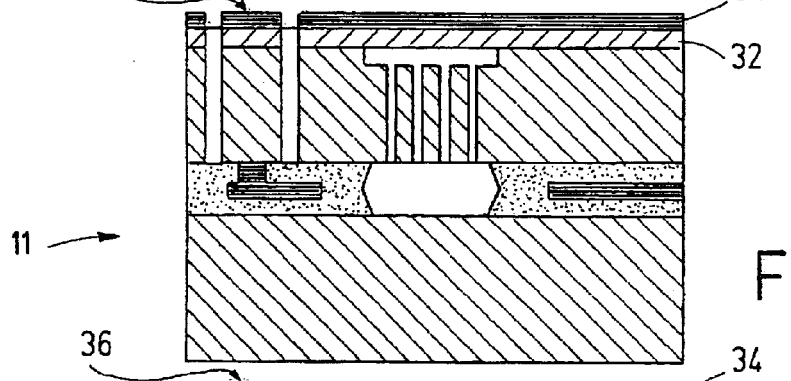
Figure 34:
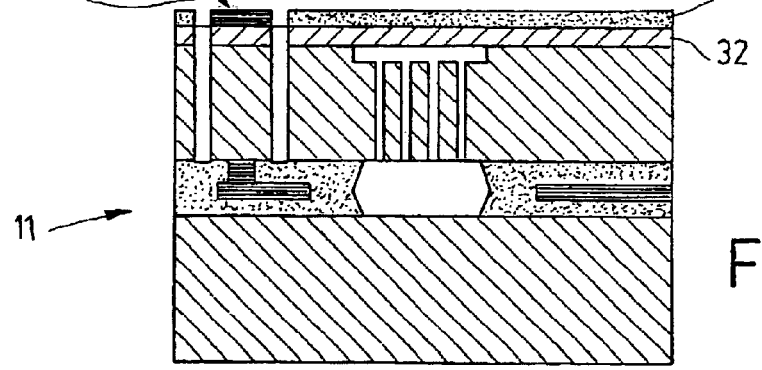

In a further, already mentioned advantageous embodiment, the structuring of the deposition layer 32 and the cover layer 34 is omitted until or until just before the deposition and structuring of the metal pads 36 (see FIGS. 32–34, 34'). Not until directly before the deposition of the metallizing 36 is etching of the sealing layer 34 performed, in the immediate region of the bond pads and around them, in order to make the bond regions free of insulating layers. In an especially advantageous embodiment, the metal layer 36 for the bond pads simultaneously acts as a sealing layer 34. In this latter case, the sealing layer 34, after being deposited over the full surface, must be opened again around the bond pads, to enable through-etching of the deposition layer 32 there and thus the creation of electrically insulated contact pads 36.

In a further variant, the epipolysilicon layer 16 is initially not yet etched through in the region of the contact pads 36, but instead is still present over the full surface. In the production of the sensor structures 26 by anisotropic deep etching, the bond regions are accordingly initially not included. Not until the contact pads 36 are etched free, or in other words the deposition layer 32 and the sealing layer 34, if the latter is not identical with the metallizing layer of the contact pads 36, are etched through is the epipolysilicon layer 16 etched through, down to the buried oxide 12, around the bond pads. The same deep etching process can be employed for both the silicon layer 32 and for the epipolysilicon layer 16. Accordingly a "double-trench" process takes place, in which a first deep trench is made for the sensor structures 26 themselves, and a second deep trench for the bond pad regions is made later in the process sequence. In both variants, the electrical connection of the sensor structures 26 is effected via the contact pads 36 through the deposition layer 32 and the layer 16. The deposition layer 32 must accordingly have adequate electrical conductivity to enable large-area electrical contact, but in practice this is not a problem, given adequate doping, even if the deposition layers 32 are relatively thick. The aforementioned variants can be learned for the sake of illustration from FIGS. 32–34, in which a metal is used as the seal and bond pad, and FIG. 34', in which a dielectric is used as a seal and metal is used as the bond pad.

The process steps, sketched in FIGS. 15 and 11, in which the sealing layer 34 is applied can be used especially advantageously for adjusting a desired internal pressure inside the sensor chamber 28. The adjustable pressure range includes pressures from a few microbars up to atmospheric pressure. In contrast to the conventional methods, because of the very rapid sealing the tolerance in the pressure adjustment can be kept relatively low. For adjusting the pressure, the procedure can be as follows:

In an embodiment with a permeable deposition layer 32 (one that is in-situ permeable, or is retroactively made porous to create permeability), after the foundation wafer 11, by then fully processed up to the point of the application of the sealing layer 34, is inserted into a process chamber for deposition of the sealing layer 34, heating is first done to a temperature between 300° C. and 450° C.; at the same time, instead of process gases, an inert gas is delivered to the process chamber at a given pressure. As the inert gas, helium is for instance suitable, since it can diffuse especially quickly through the deposition layer 32 that is either in-situ permeable or made permeable by porosification, so that in the sensor a rapid establishment of equilibrium (internal pressure equals outer pressure) is possible. Only after that are the process gases required for the deposition of the sealing layer 34 supplied and the deposition plasma ignited. If permeable polysilicon (in-situ permeable, or made permeable by porosification is used, then only a few seconds elapse in the time between the leaving behind of the desired concluding pressure in the process chamber and the deposition of an adequately thick sealing layer 34.

For a known layer thickness and permeability of the deposition layer 32, the pressure change to be expected in this time can be calculated, so that suitable precautions can be planned for. It is also possible initially to leave the deposition pressure at the desired enclosed pressure for the capping, and already to start the deposition process early while still in the presence of the inert gas. Only after the initiation of the deposition process is the chamber pressure readjusted to the pressure range that is actually optimal for the deposition. As a result, while the deposition process proceeds non-optimally for a few seconds and reaches its most favorable operating range only after the pressure adaptation has been made, still proceeding in this way means that the time between leaving the capping pressure and the completed hermetic sealing of the sensor element is shortened. For experimentally determining the enclosed pressure and monitoring the method, the diaphragm bulging can be assessed, for instance by interferometry, or quality parameters of the enclosed structures 26 can be ascertained by resonant excitation. Quality control for the method is also easily possible.

It has proved to be especially favorable for this process course to be used to produce surface-micromechanical capacitive pressure sensors. FIGS. 17 and 18, on the one hand, and 19 and 20, on the other, accordingly show two possible embodiments of such pressure sensors. First, as shown in FIGS. 17 and 19, a layer 32 that is permeable or is retroactively made permeable by etching is deposited—optionally in structured form—above the sensor chamber 28 that is filled with the oxide 30. Subsequent etching out of the oxide 30 and sealing with the sealing layer 34 lead to the application forms shown in FIGS. 18 and 20.

In the first case, a torsion rocker 39 is implemented in the pressure sensor; this rocker is connected to the covering 13 via a coupling element 42. A seismic mass 38 is suspended—analogously to a beam scale—symmetrically via torsion springs 40 and centrally with regard to both sides. The mask 32 is perforated for the performance of the sacrificial layer etching; the perforation is not shown here. After the deposition and planarization of the oxide 30, a hole is made in the oxide 30, somewhat outside the middle of the torsion rocker 39, using a photographic technique, and the oxide 30 is etched. Above it, the deposition layer 32 can for instance simply and advantageously be deposited as a permeable polysilicon layer, and/or it can be made permeable retroactively by etching processes, such as porosification; in the "contact hole" previously placed in the oxide 30, the silicon of the rocker 39 can be contacted directly both mechanically and electrically. If an electrical insulation of the sensor diaphragm from the torsion rocker 39 is later desired, for instance for the sake of electrical shielding from the environment, then before the polysilicon is deposited, an insulating layer can be deposited that is not attacked by the HF vapor chemistry employed afterward for sacrificial oxide etching. An example of something suitable for this is a layer of amorphous silicon carbide, which is resistant both to media that contain hydrofluoric acid and to HF vapor. This layer can be structured after the conformal deposition above the contact hole in the oxide either by a masked etching process, such that only the coupling element 42 remains, or can be machined in such a way that after a grinding process, the coupling element 42 remains, enclosed by the oxide 30. It is understood that in that case the order of the process steps can also be reversed; that is, the coupling element 42 (for instance of amorphous silicon carbide) is applied first, and then the filler oxide is deposited and planarized, and then the entire covering 13 is deposited and planarized, taking into account the pressure adjustment process parameters set beforehand.

By the two production variants for the coupling element 42—that is, simple polysilicon deposition with mechanical connection via the polysilicon, which it is understood fills up the contact hole in the oxide 30 and thus establishes the nonpositive engagement with the rocker 39, or the explicit deposition and production of an electrically insulated coupling element 42 by means of an addition layer—a mechanical connection is created between the covering 13 and the torsion rocker 39.

Because of the bending form of the covering 13 that is subjected to pressure, it is advantageous to place the coupling element 42 between the torsion axis and the center of the cover plate, or accordingly for example—as seen in FIGS. 17, 18—to the right of the torsion axis of the rocker 39 and to the left of the middle of the diaphragm. If pressure is exerted on the diaphragm, a bending line in the form of a double-S ensues, which presses the right-hand half of the rocker 39 downward, and the left-hand half of the rocker 39 accordingly moves upward. If there are two counterelectrodes (structured from the conductive layer 14) underneath the rocker 39, then the change in capacitance can be processed as a differential capacitance by means of suitable evaluation electronics. The electrical wiring of the sensor component is done in the bottom plane, through the conductive layer 14 buried there. Such a sensor, with the layout described, has an advantageously low temperature drift, because of its symmetry and the capacitive assessment by the differential capacitor array, making it possible to dispense with an expensive calibration and temperature compensation.

If the explicit differential capacitor array is dispensed, then a simpler process and design in accordance with FIGS. 19 and 20 can be considered. The seismic mass 44 is joined directly to the deposition layer 32. Also, in the way described above, a reference pressure, preferably by means of helium gas, can be enclosed in the sensor chamber 28, and the structure can be hermetically sealed by sealing of the sealing layer 34.

If pressure is exerted on the structure, the mass 44 is pressed downward, thus decreasing the spacing from the layer 14 lying below, which functions as a counterelectrode, and a change in capacitance accordingly ensues. The electrical connection and the embodiment of the counterpart electrode can in turn be accomplished via the layer 14 and extended to the outside. One thus obtains a simple, robust, capacitive pressure sensor by means of surface micromechanics. The evaluation electronics developed in standard form for acceleration sensors can continue to be used, if a differential capacitor array is embodied by a fixed-value capacitor connected externally to the measuring capacitor.

Figure 21:
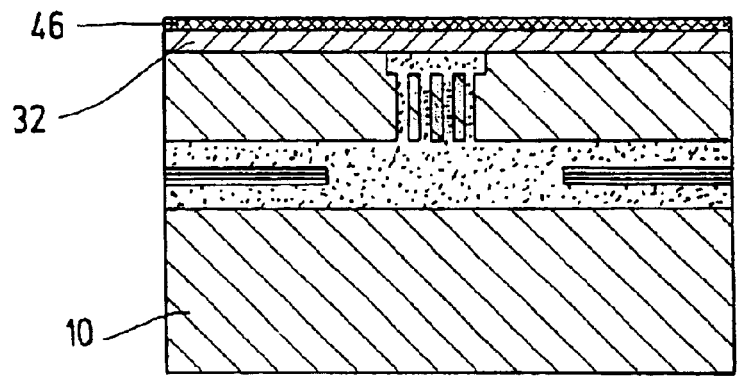
FIGS. 21–23, an alternative procedure for varying the permeability of the deposition layer by means of an electrochemical etching operation.
Figure 22:
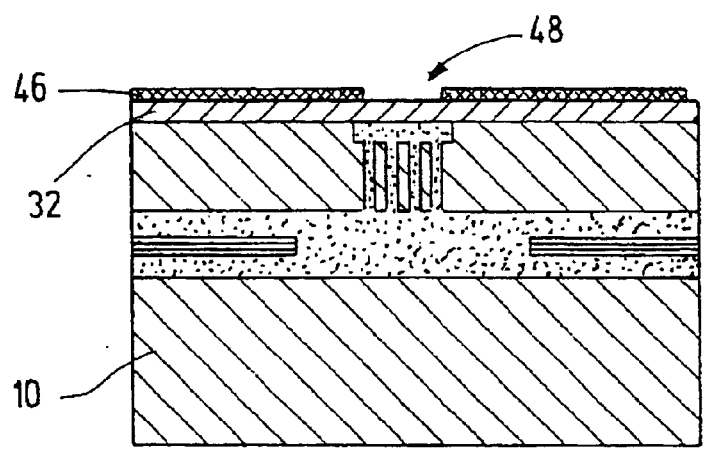
Figure 23:
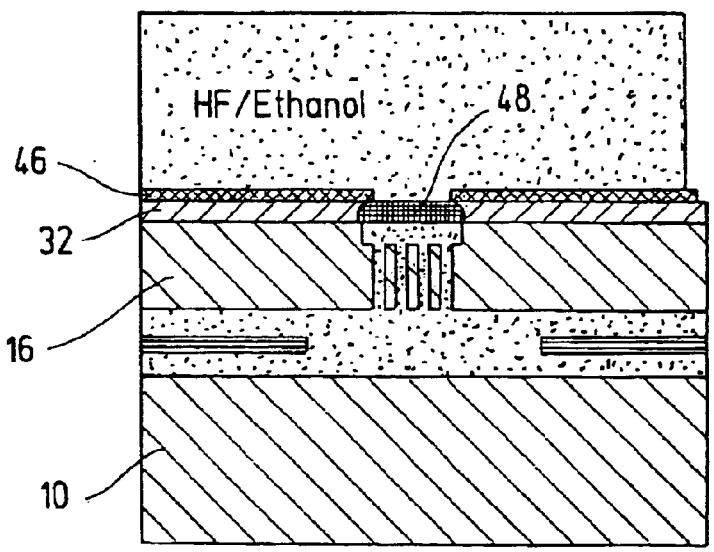
Figure 24:
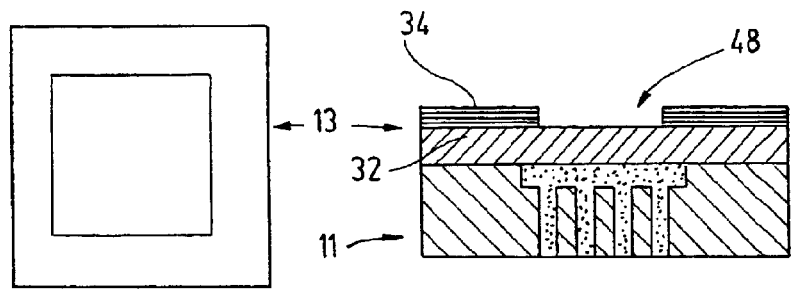
FIGS. 24–27, alternative masking structures of metal layers that can be used in a galvanic process for adjusting the permeability of the deposition layer.
Figure 25:
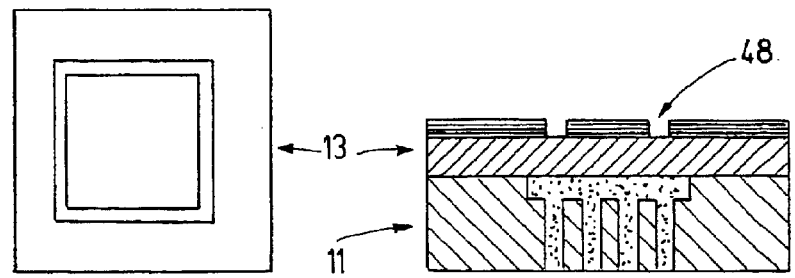
Figure 26:
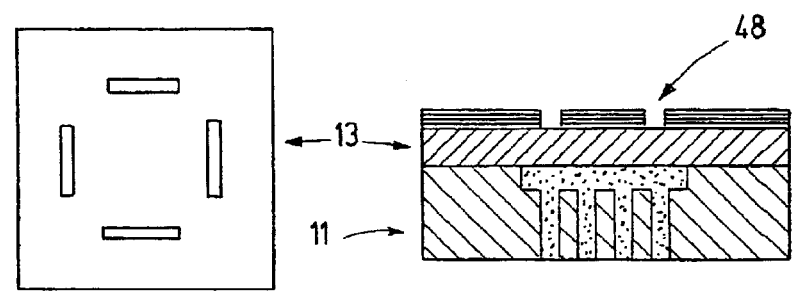
Figure 27:
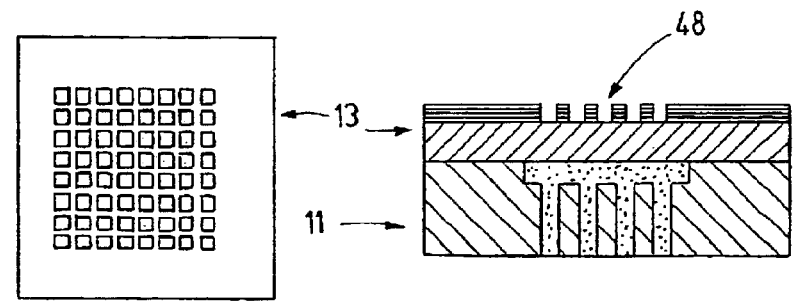
Figure 28:
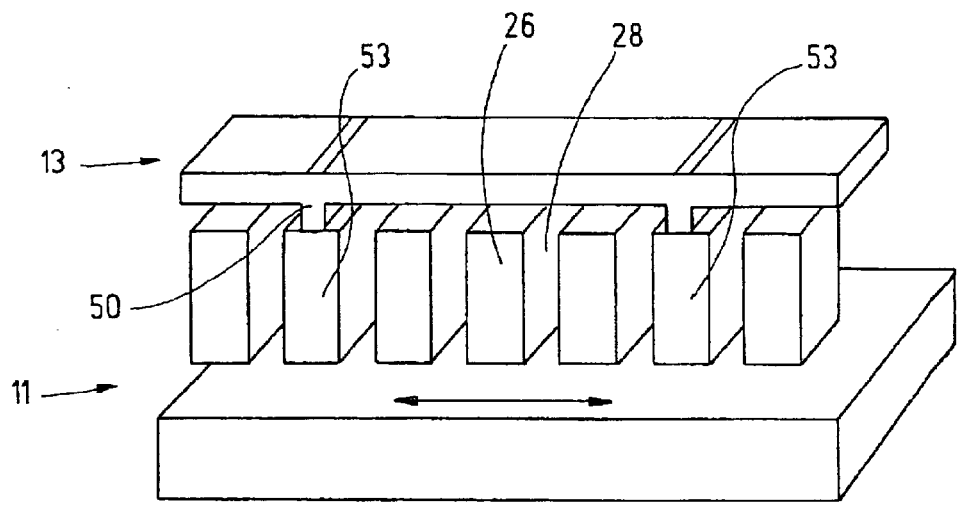
FIG. 28, a covering with support elements.
Figure 29:
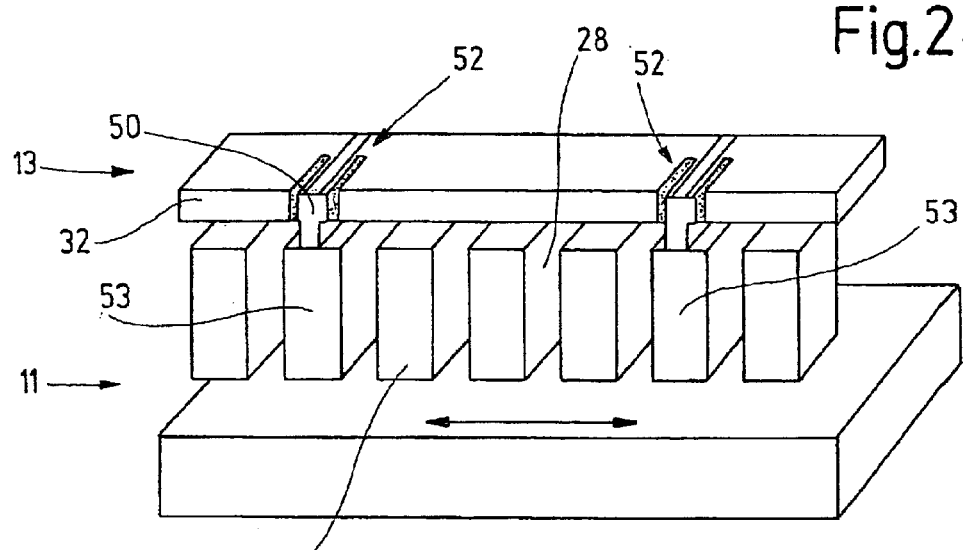
FIG. 29, a covering with support elements and etching openings.

The permeability of the deposition layer 32 for the etching medium and the resultant reaction products can also be forced retroactively after deposition of the layer 32. A first method of this kind is sketched in FIGS. 21–23, in which an electrochemical etching operation is primarily used for converting silicon into (permeable) porous silicon. First—as already described—the procedure is the same up to and including the deposition of the deposition layer 32. Next, a suitable masking layer 46 is applied (FIG. 21), and in a known manner, such as by an additional lithography step, structuring is performed, so that a region 48 in which the properties of the layer 32 are to be varied or modified is made accessible (FIG. 22).

The actual electrochemical etching operation is performed in the presence of an HF electrolyte, such as a mixture of hydrofluoric acid and ethanol, and leads to the formation of porous structures or etching openings in the regions 48 of the layer 32 that are exposed to the electrolyte.

It has proved especially advantageous in the electrochemical etching operations of the type described to perform an irradiation of the surface in addition, in a wavelength range from 100 nm to 1000 nm, and in particular 350 nm to 800 nm, since the homogeneity of the process is improved thereby. An electrical connection by application of an anodic potential can be done on the one hand via the top side of the layer 32 and on the other from the epipolysilicon layer 16 or the foundation wafer 11 (back-side contact) via the underside of the layer 32. The large-area back-side contact via the foundation wafer 11 has the advantage that with it, a better-defined, more-homogeneous distribution of current density of the anodizing current is achieved, since the current has to overcome a maximum of only the thickness of the foundation wafer 11 in order to reach the region 48 to be treated. Expediently, a high n-doping of the layers of the foundation wafer 11—above all, the wafer underside of the substrate (10)—is provided ($n^{++}$), which becomes possible especially simply by POCL deposition and ensuing forcing of phosphorous into the silicon, but also by ion implantation of phosphorous, arsenic or antimony. The $n^{++}$ doping of the back side of the foundation wafer 11 reduces the Schottky barrier that is present in the electrolyte/silicon contact region. Suitably adapted doping of the layer 32 in the region 48 that is to be varied can be used to control the process. It has been demonstrated for instance that p-doping leads to the formation of mesoporous pores, while n-doping leads to etching openings ranging from a few tens of nanometers to micrometers.

Alternatively to the electrochemical etching operation, the procedure can be as shown in FIGS. 24–27 for exemplary embodiments. First, the still inadequately permeable layer 32 is applied, and next, using known masking methods, a metal layer is deposited and structured. In the ensuing galvanic production of porous polysilicon in the region 48, the metal thus simultaneously takes on the function both of masking the silicon surface of the layer 32 in the regions that are not to be electrochemically anodized, and of a cathode in the galvanic silicon/electrolyte/metal cell. The processes that lead to the formation of the porous polysilicon can be controlled via the composition of the HF electrolyte and via the incident current density in this galvanic cell. The current densities are dependent on the ratio of area of metal to silicon. The larger the metal area, the higher the current density. Typical metal to silicon area ratios are between 10 and 20 to 1. The advantage of this technique is that electrical contacting of the wafer is not necessary.

To achieve these ratios, parts of the metal face of the region 48, which is to be made porous, of the covering 13 can be covered with a grid. Care should be taken that the width of the metal tracks is greater than the thickness of the layer 32 to be etched, because otherwise excessive underetching and detachment of the metal could occur. A selection among possible embodiments can be learned from the plan views and sectional views of FIGS. 24–27.

It is also conceivable, by a modified stain-etch operation, to treat the regions 48 that are to be made porous with a mixture of hydrofluoric acid, nitric acid and water. All the other regions must be protected with a suitable masking layer, for instance of silicon nitride. By way of the composition, and in particular the nitric acid concentration, and the exposure times, the porosity and layer thickness of the modified porous silicon region can be controlled. Moreover, there is an empirically detectable influence of dopants, making it possible to control the process that creates the porosity.

A further alternative embodiment of the thin-film sensor cap, in which support elements 50 are present on the underside of the deposition layer 32, can be seen in FIGS. 28–31. Up to the deposition of the oxide 30, as shown in FIG. 6, the method described at the outset can be employed. However, a complete planarization of the oxide film 30 down to the height of the epipolysilicon layer 16 is dispensed with. Instead, a structured removal of material is done, in which the oxide 30 is removed from those regions that are later to form the support elements 50. These regions are logically located above the regions of the epipolysilicon layer 16, which are not supposed to be further attacked in the ensuing etching process.

Figure 31:
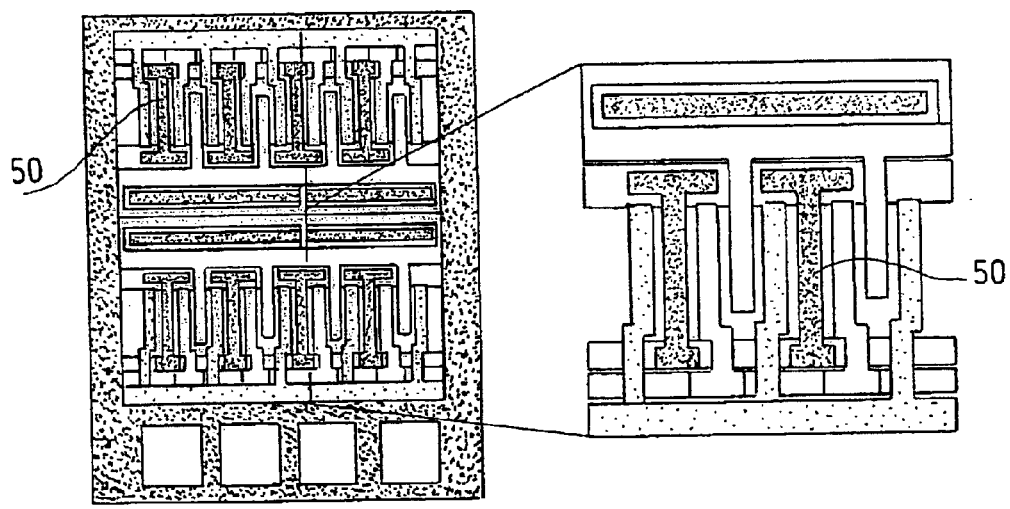
FIG. 31, an alternative embodiment of the support elements.

The individual support elements 50 are typically encompassing support struts or support columns, which thus define the sensor chamber 28 that is covered by the covering 13. The necessary micromechanical structures 26 are located inside the sensor chamber 28. In accordance with FIG. 28, slight spacings of the support elements 50 and thus slight clamping widths of the covering 13 can be achieved. Clamping widths below 10 μm are thus feasible. However, this also means reduced sagging upon subjection to an overpressure, and the spacing of the covering 13 and the sensor element can be reduced so much that it is impossible to lift the sensor structure 26 out in the event of a mechanical overload. Since the bond frames necessary in the conventional sensors can be drastically reduced in size, a major reduction in surface area additional ensues, so that more than twice as many acceleration sensors can be processed on the same foundation wafer 11. FIG. 31 in this respect shows a further advantageous embodiment with T-shaped support elements 50, which lead to especially stable structures.

For the case where instead of using a permeable polysilicon as the deposition layer 32, etching openings 52 by way of which the sacrificial oxide etching takes place are to be made retroactively, the design shown in FIG. 2 has proved advantageous. The etching openings 52 are disposed here such that upon the deposition of the sealing layer 34, at most the structural elements 53 of the sensor that are not fundamental to its function are exposed to the deposition plasma. These structural elements 53 that are not fundamental to the function are in fact precisely those elements that are connected to the support elements 50. After the sacrificial etching, it is optionally possible via the etching openings 52 to deposit suitable anti-adhesion layers in the region of the structures 26 as well.

Figure 30:
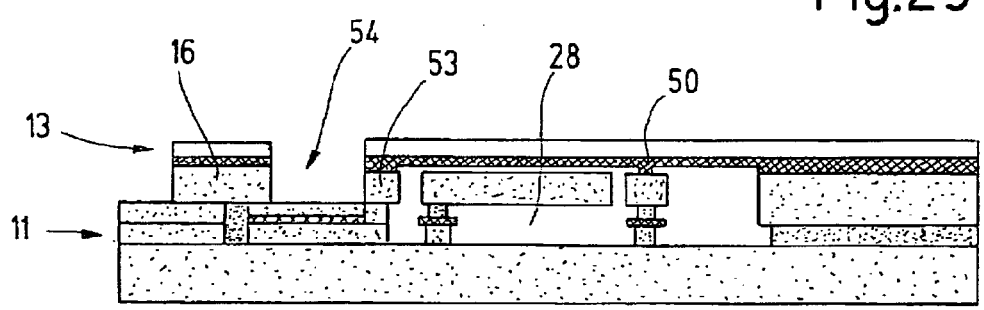
FIG. 30, a covering with support elements and a contacting region for bond pads.

A sensor in accordance with FIG. 30 can be made with the aid of the process steps described above. Along with the possibility, described in conjunction with FIGS. 15 and 16, of simultaneously structuring both the deposition layer 32 and the layer 34, or of initially not structuring the deposition layer 32, and initially leaving it over the full surface and only at the end etching contact pads 36 that are electrically insulated from the system, it is also possible to machine the epipolysilicon layer 16 located beneath, so that the opening 54, by way of which contacting can later be done, can be created in one process step. In electrochemical etching, contacting in turn occurs via the back side of the wafer. The layers are then electrically connected via the support elements 50, so that a preferably high permeability is established in the region of the support elements 50 by the formation of porous silicon. This electrical contacting of the layer 32 can also be done next to the sensor region 28, toward the substrate 10.

What is claimed is:

1. A sensor, comprising a foundation wafer having a sensor chamber; at least one silicon-based micromechanical structure integrated with said sensor chamber of said foundation wafer; at least one covering that covers said foundation wafer in a region of said sensor chamber, said covering including a first layer which is a deposition layer and is permeable to an etching medium and reaction products, and a hermetically sealing second layer which is a sealing layer and located above said first layer, said deposition layer which is the first layer being permeable in a region of said sensor chamber to the etching medium and a reaction product, and said deposition layer for being permeable comprising structures selected from the group consisting of etching openings and porous regions.

2. A sensor as defined in claim 1, wherein said deposition layer has an underside provided with support elements that create a connection between said foundation wafer and said covering.

3. A sensor as defined in claim 2, wherein said etching openings are disposed in a region of said support elements.

4. A sensor as defined in claim 2, wherein said support elements are configured to create an electrical connection between said foundation wafer and said covering.

5. A sensor as defined in claim 2, wherein said support elements are configured to establish a mechanical stable connection between said foundation wafer and said covering.

6. A sensor as defined in claim 2, wherein said support elements are configured to prevent an excessive sagging of the covering upon subjection to an overload.

7. A sensor as defined in claim 2, wherein said individual support elements are spaced apart from one another by a distance from several micrometers to several tens of micrometers.

8. A sensor as defined in claim 1, wherein said deposition layer is of polysilicon.

9. A sensor as defined in claim 1, wherein said deposition layer has an underside provided with a torsion rocker, wherein said torsion rocker is connected to the covering via a coupling element.

* * * * *